(12) United States Patent
Machida et al.

(10) Patent No.: US 8,587,362 B2
(45) Date of Patent: Nov. 19, 2013

(54) GATE DRIVER AND SEMICONDUCTOR DEVICE EMPLOYING THE SAME

(75) Inventors: Osamu Machida, Niiza (JP); Hironori Aoki, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 13/306,265

(22) Filed: Nov. 29, 2011

(65) Prior Publication Data

US 2012/0139589 A1  Jun. 7, 2012

(30) Foreign Application Priority Data

Dec. 6, 2010 (JP) ................................. 2010-271407

(51) Int. Cl.
*H03K 17/687* (2006.01)

(52) U.S. Cl.
USPC ............ 327/427; 327/434; 327/502; 327/584

(58) Field of Classification Search
USPC ................. 327/427, 384, 389, 434, 502, 584; 323/266, 277; 361/88, 91.1, 91.2, 91.5, 361/91.6, 91.7, 118
See application file for complete search history.

(56) References Cited

U.S. PATENT DOCUMENTS

| | | | | |
|---|---|---|---|---|
| 4,186,418 A * | 1/1980 | Seiler | ........................... | 361/91.6 |
| 5,162,966 A * | 11/1992 | Fujihira | ........................ | 257/140 |
| 5,304,802 A * | 4/1994 | Kumagai | ........................ | 257/328 |
| 5,465,190 A * | 11/1995 | Meunier et al. | ............... | 361/91.5 |
| 7,129,759 B2 * | 10/2006 | Fukami | ......................... | 327/110 |
| 7,310,006 B2 * | 12/2007 | Shimada | ......................... | 326/83 |
| 7,453,308 B2 * | 11/2008 | Tihanyi | ......................... | 327/309 |
| 7,576,964 B2 * | 8/2009 | Nakahara | ..................... | 361/91.1 |
| 7,741,884 B2 * | 6/2010 | Kawagishi et al. | ........... | 327/108 |
| 8,254,070 B2 * | 8/2012 | Arndt et al. | ..................... | 361/56 |

FOREIGN PATENT DOCUMENTS

| JP | 8-288817 | 11/1996 |
|---|---|---|
| JP | 2001-245466 | 9/2001 |

OTHER PUBLICATIONS

U.S. Appl. No. 13/482,384, filed May 29, 2012, Machida, et al.

* cited by examiner

*Primary Examiner* — Lincoln Donovan
*Assistant Examiner* — Jung H. Kim
(74) *Attorney, Agent, or Firm* — Oblon, Spivak, McClelland, Maier & Neustadt, L.L.P.

(57) ABSTRACT

A gate driver for driving a gate of a switching element Tr7 includes a driving part that drives the switching element according to a control signal and an active clamp circuit to clamp the voltage between the first and second main terminals of the switching element through the driving part. If a voltage applied between a first main terminal (drain) and a second main terminal (source) of the switching element exceeds a predetermined voltage, the active clamp circuit forcibly blocks a driving operation of the driving part from driving the switching element.

4 Claims, 4 Drawing Sheets

GATE DRIVER AND SEMICONDUCTOR DEVICE EMPLOYING THE SAME

BACKGROUND OF THE INVENTION

1. Field of the Invention

The present invention relates to a gate driver for driving the gate of a switching element and to a semiconductor device employing the gate driver.

2. Description of Related Art

Recent output transistors used in, for example, switching power sources carry out high-speed switching to cause a large counter electromotive voltage that produces a surge voltage between the drain and source of the output transistor when the transistor is turned off to open the drain and source thereof. Such a surge voltage may break the transistor, and therefore, the transistor must have a means to protect the transistor from the surge voltage.

In connection with this, Japanese Unexamined Patent Application Publication No. H08-288817 (Patent Document 1) discloses a semiconductor device for disconnecting an inductive load at high speed from a high-side switch and a technique of suppressing a drain-source voltage of the high-side switch. In "Description of Related Art" of Patent Document 1, there is mentioned an active clamp circuit of a constant voltage element and a diode that are connected in series. The active clamp circuit is arranged between the drain and gate of a high-side switch, to suppress a drain-source voltage of the high-side switch and protect the high-side switch from a surge voltage.

Japanese Unexamined Patent Application Publication No. 2001-245466 (Patent Document 2) mentions about a power conversion apparatus that suppresses and lowers an excessively high surge voltage generated when an IGBT or a MOSFET is switched at high speed. This power conversion apparatus adopts an active clamp circuit applicable to either of high-side and low-side switches. The active clamp circuit connects a capacitor in parallel with a diode, to speedily form a negative feedback path and clamp an overvoltage.

SUMMARY OF THE INVENTION

The active clamp circuit mentioned in Patent Documents 1 and 2 generates and provides a clamp current through a gate resistance of the switching element when a gate drive signal is OFF, and thereby increasing a voltage drop of the gate resistance. When the voltage drop reaches a gate threshold voltage of the switching element, the switching element starts to pass a drain current to decrease a drain-source voltage. Namely, the active clamp circuit balances the drain-source voltage of the switching element with the voltage generated by the active clamp circuit, so that the drain-source voltage may not exceed a predetermined voltage (for example, a rated voltage of the switching element).

If the gate resistance of the switching element has a value of 10Ω and the gate threshold voltage of the same is 5 V, the active clamp circuit allows to pass a current up to of 0.5 A. According to Patent Document 1, a power source voltage applied to the switching element is about 20 V. The power source voltage of this extent causes only small surge power on the active clamp circuit. A power source voltage applied to a switching element used for a switching power source or a motor driving apparatus, however, is high such as 200 V to 400 V. In this case, the active clamp circuit must employ elements having a surge resistance of 100 W to 200 W because the surge power applied to the active clamp circuit is the product of the surge voltage and the above-mentioned current. Then, the techniques mentioned in Patent Documents 1 and 2 are not adoptable because they must add a heat radiating means for the active clamp circuit, to increase costs and decrease reliability.

If the switching element is an element having no avalanche resistance, such as a GaN High-Electron-Mobility-Transistor (HEMT), the switching element will break if receiving a surge voltage exceeding a rated voltage of the switching element. Accordingly, a gate driver for driving such a switching element must have an active clamp circuit. Unlike a silicon MOSFET having a gate resistance of 10 ohms to several tens of ohms, the GaN HEMT has a gate resistance of nearly zero ohms to increase a drive current. The active clamp circuits according to the related arts are inapplicable to the GaN HEMT because elements of the active clamp circuits of the related arts are unable to sustain such a large drive current.

To solve the problems of the related arts, the present invention provides a gate driver employing an active clamp circuit capable of reducing a power loss without deteriorating responsiveness and a semiconductor device employing the gate driver.

According to an aspect of the present invention, the gate driver for driving a gate of a switching element includes a driving part configured to drive the switching element according to a control signal and an active clamp circuit configured to clamp the voltage between the first and second main terminals of the switching element through the driving part, wherein if a voltage applied between first and second main terminals of the switching element exceeds a predetermined voltage, the active clamp circuit forcibly blocks a driving operation of the driving part from driving the switching element.

According to another aspect of the present invention, the semiconductor device is connected between terminals of a DC power source through a load, to control a current of the load. The semiconductor device includes a switching element connected in series to the DC power source and load as well as the driving part.

DESCRIPTION OF PREFERRED EMBODIMENTS

Gate drivers and semiconductor devices according to embodiments and modifications of the present invention will be explained in detail with reference to the drawings.

Figure 1:
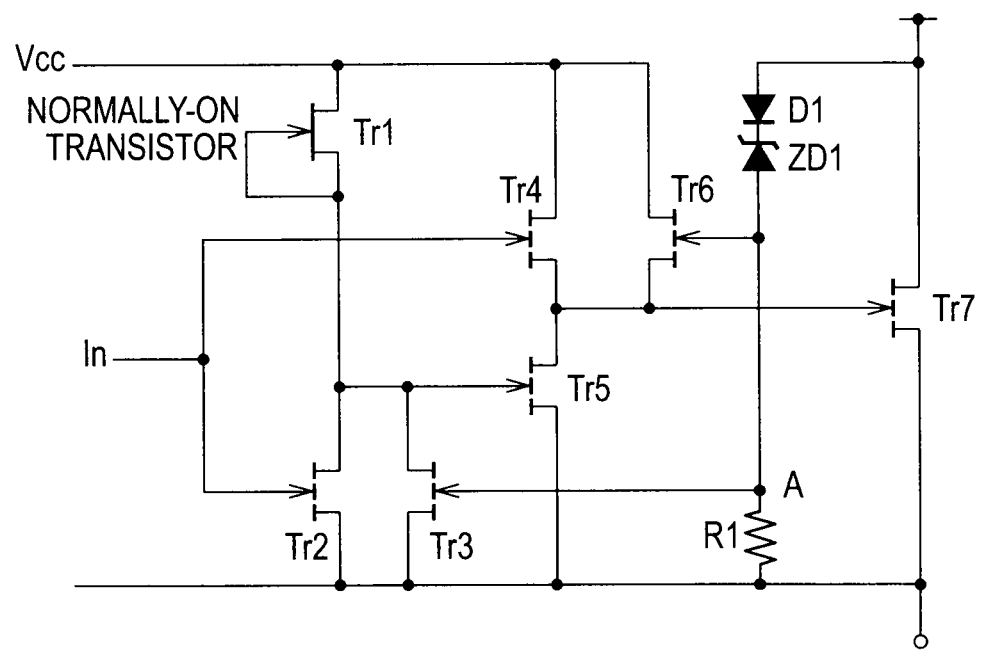
FIG. 1 is a circuit diagram illustrating a gate driver according to an embodiment of the present invention.

FIG. 1 is a circuit diagram illustrating a gate driver according to an embodiment of the present invention. The gate driver drives a switch element Tr7 and includes transistors Tr1 to Tr6, a diode D1, a zener diode ZD1, and a resistor R1. The switch element Tr7 corresponds to the "switching element" stipulated in the claims and is a semiconductor element such as a GaN HEMT. The gate driver and switch element Tr7 form a semiconductor device according to the preset embodiment.

According to the present embodiment, the transistors Tr1 to Tr6 may be n-type MOSFETs, or n-type GaN HEMTs, or any combination of other types of semiconductor elements that provide the function of the present embodiment.

The transistors Tr1, Tr2, Tr4, and Tr5 form the "driving part" stipulated in the claims, to drive the switch element Tr7 according to a control signal supplied to an input terminal In.

The transistor Tr1 has a drain connected to a power source terminal Vcc, a source connected to a gate of its own, drains of the transistors Tr2 and Tr3, and a gate of the transistor Tr5. According to the present embodiment, the transistor Tr1 is a normally-ON GaN HEMT serving as a constant current element. The transistor Tr1 may be replaced with a constant current element, or a resistor.

The input terminal In receives a control signal from an external controller (not illustrated). The control signal is used to turn on/off the switch element Tr7. The input terminal In is connected to gates of the transistors Tr2 and Tr4.

The transistor Tr2 has the drain connected to the source of the transistor Tr1, the gate connected to the input terminal In, and a source connected to a source of the switch element Tr7. The transistor Tr4 has a drain connected to the power source terminal Vcc, the gate connected to the input terminal In, and a source connected to a drain of the transistor Tr5, a source of the transistor Tr6, and a gate of the switch element Tr7. The transistor Tr5 has the drain connected to the source of the transistor Tr4, the gate connected to the source of the transistor Tr1, and a source connected to the source of the switch element Tr7.

Normal operation of the driving part (Tr1, Tr2, Tr4, Tr5) of the gate driver according to the present embodiment will briefly be explained. The normal operation is carried out when there is no surge voltage, or when there is a small surge voltage that is lower than an active clamp voltage. In the normal operation, the driving part turns on/off the switch element Tr7 according to a gate drive signal supplied to the input terminal In.

When the gate drive signal is high, the transistors Tr2 and Tr4 turn on. The ON operation of the transistor Tr2 zeroes a gate voltage of the transistor Tr5, to turn off the transistor Tr5. At this time, the ON operation of the transistor Tr4 applies a gate voltage from the control power source Vcc to the gate of the switch element Tr7 through the transistor Tr4, to turn on the switch element Tr7.

When the gate drive signal to the input terminal In becomes low, the transistors Tr2 and Tr4 turn off. The gate of the transistor Tr5 receives a bias voltage of the transistor Tr1, and therefore, turns on. This results in zeroing the gate voltage of the switch element Tr7, to turn off the switch element Tr7.

The diode D1, zener diode ZD1, resistor R1, and transistors Tr1 and Tr6 form the "active clamp circuit" stipulated in the claims. When a voltage applied between the drain (first main terminal) and source (second main terminal) of the switch element Tr7 exceeds a predetermined voltage, the active clamp circuit forcibly blocks the driving operation of the driving part from the switch element Tr7 and drives the switch element Tr7 so that the voltage between the drain and source of the switch element Tr7 is clamped. Operation of the active clamp circuit will be explained later.

The diode D1 has an anode connected to the drain of the switch element Tr7 and a cathode connected to a cathode of the zener diode ZD1. The zener diode ZD1 has an anode connected to gates of the transistors Tr3 and Tr6 and a first end of the resistor R1 and the cathode connected to the cathode of the diode D1. The resistor R1 has the first end connected to the gates of the transistors Tr3 and Tr6 and the anode of the zener diode ZD1 and a second end connected to the source of the switch element Tr7.

The transistor Tr3 has the drain connected to the source of the transistor Tr1, the gate connected to the anode of the zener diode ZD1, and a source connected to the source of the switch element Tr7. The transistor Tr6 has a drain connected to the power source terminal Vcc, the gate connected to the anode of the zener diode ZD1, and a source connected to the gate of the switch element Tr7.

Operation of the active clamp circuit when a high voltage is connected through a load to the drain of the switch element Tr7 will briefly be explained. Here, the switch element Tr7 is supposed to be a switch element of a switching power source and the load is supposed to be an inductive load.

When the switch element Tr7 connected to the inductive load is turned on and off, a counter electromotive voltage of the inductive load causes a surge voltage between the drain and source of the switch element Tr7 as the switch element Tr7 turns off. To absorb the surge voltage, a snubber circuit including a resistor and capacitor is usually connected between the drain and source of the switch element Tr7. The snubber circuit, however, is unable to suppress a high surge voltage caused by a steep current that may occur at startup of the switching power source or when an output short circuit occurs.

If the switch element Tr7 is a silicon MOSFET, the surge voltage may be clamped with an avalanche voltage intrinsic to the silicon MOSFET. The clamped surge energy is converted into heat, and if the produced heat does not rise a temperature of the silicon MOSFET up to a junction temperature of the silicon MOSFET, the silicon MOSFET will not break.

According to the present embodiment, the switch element Tr7 is a GaN HEMT having no avalanche tolerance, and therefore, the switch element Tr7 will break at once when a surge voltage exceeding a rated voltage of the GaN HEMT is applied thereto.

To solve the problem of surge voltage, the gate driver according to the present embodiment employs the active clamp circuit (D1, ZD1, R1, Tr3, Tr6) to absorb the surge voltage. The diode D1, zener diode ZD1, and resistor R1 detect the surge voltage. Unlike the related arts that directly use the detected surge voltage, i.e., a voltage drop of the resistor R1 as a gate signal to the switch element Tr7, the active clamp circuit according to the present embodiment amplifies the detected surge voltage through the transistor Tr6 and obtains a gate signal to the switch element Tr7 from the control power source Vcc.

At the same time, the active clamp circuit of the embodiment uses the detected surge voltage, i.e., the voltage drop of the resistor R1 as a gate drive voltage to the transistor Tr3, to turn on the transistor Tr3 and thereby turn off the transistor Tr5 of the driving part. At this time, the gate signal at the input terminal In is OFF, and therefore, the gate driver is in an OFF operating state. Namely, the gate of the switch element Tr7 at this time is driven only by the transistors Tr1 and Tr5, and therefore, the active clamp circuit is able to disconnect the driving part from the gate of the switch element Tr7 by turning off at least the transistor Tr5.

Namely, the active clamp circuit of the present embodiment isolates the driving part to forcibly block the operation of the driving part with respect to the switch element Tr7, and at the same time, turns on the switch element Tr7 through the transistor Tr6.

The active clamp circuit amplifies, through the transistor Tr6, the detected surge voltage and drives the gate of the switch element Tr7 from the control power source Vcc. This results in greatly reducing a power loss of the zener diode ZD1 acting as an active clamp element and improving the reliability of operation of the switch element Tr7 compared with the related arts.

Figure 2:
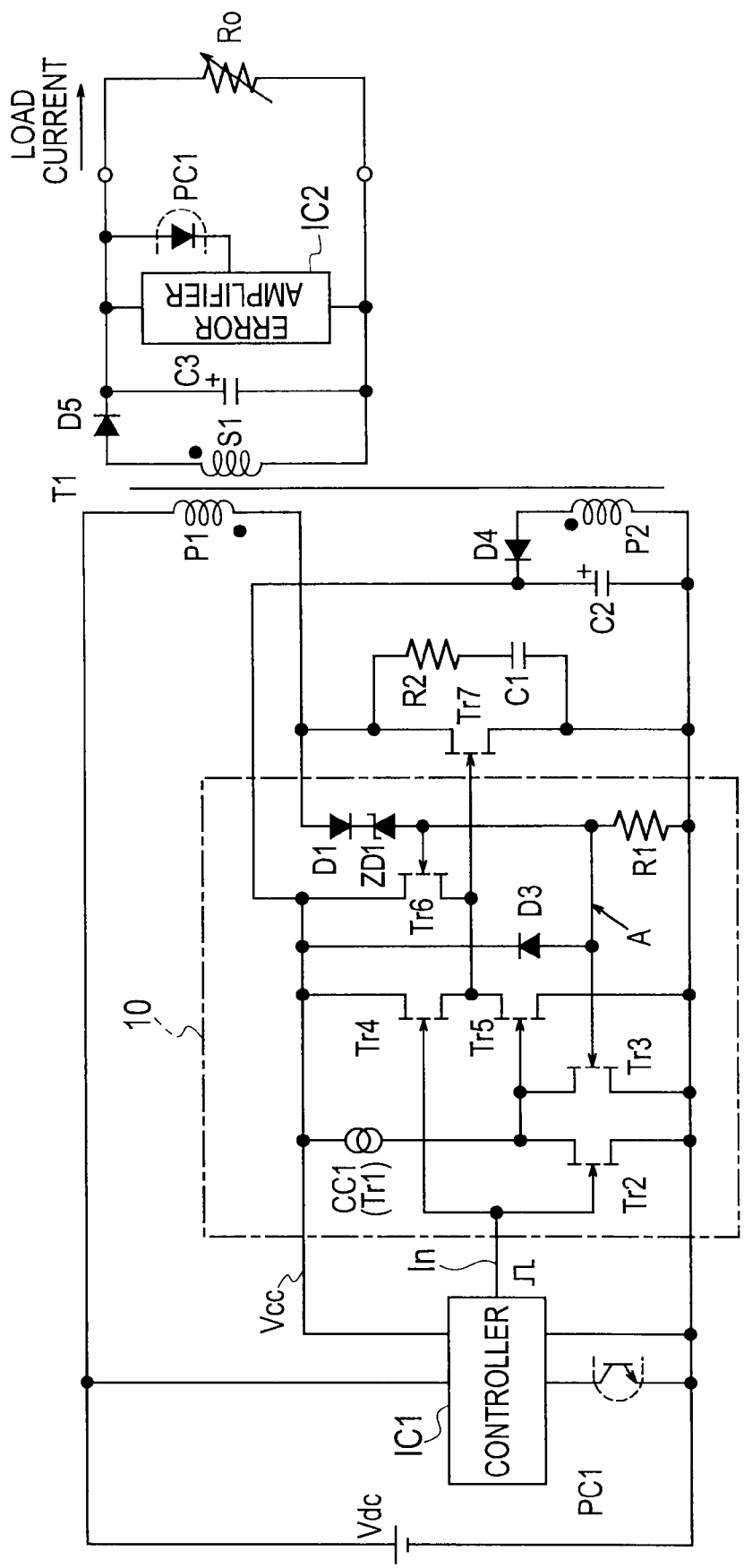
FIG. 2 is a circuit diagram illustrating a switching power source employing a gate driver that is similar to the gate driver of FIG. 1.

FIG. 2 is a circuit diagram illustrating a flyback switching power source employing a gate driver 10 according to an embodiment of the present invention. The gate driver 10 is similar to the gate driver of FIG. 1. The switching power source of FIG. 2 has a standard configuration except the gate driver 10. The gate driver 10 of FIG. 2 is basically the same as the gate driver of FIG. 1 except that the gate driver 10 of FIG. 2 uses a constant current source CC1 instead of the transistor Tr1 of FIG. 1 and additionally has a diode D3. Operation of the gate driver 10 of FIG. 2 is basically the same as that of the gate driver of FIG. 1. Effect of the diode D3 will be explained later.

In FIG. 2, the gate driver 10 and a switch element Tr7 form a semiconductor device according to the present embodiment. The semiconductor device is connected between terminals of a DC power source Vdc through a load and controls a current passing through the load. The switch element Tr7 is connected in series to the DC power source Vdc and load. A potential of a source of the switch element Tr7 is at ground potential.

In the switching power source of FIG. 2, the DC power source Vdc is connected through a primary winding P1 of a transformer T1 to the switch element Tr7, which is turned on and off to accumulate power in the primary winding P1 and supply the power to the secondary side through a secondary winding S1 of the transformer T1.

The secondary winding S1 of the transformer T1 is connected to a rectifying-smoothing circuit including a diode D5 and a capacitor C3. To stabilize an output voltage rectified and smoothed through the rectifying-smoothing circuit, an error amplifier 102 is connected in parallel with the capacitor C3, the error amplifier IC2 sending an error signal through a photocoupler PC1 to a controller IC1 on the primary side.

Based on the error signal, the controller IC1 outputs a control signal through an input terminal In to the gate driver 10 in order to control ON/OFF of the switch element Tr7.

Between the drain and source of the switch element Tr7, a series circuit including a resistor R2 and a capacitor C1 is connected. This series circuit functions as a snubber circuit to absorb a surge voltage from the primary winding P1 of the transformer T1. A diode D4, a capacitor C2, and a primary winding P2 of the transformer T1 form a control power source Vcc for the controller IC1 and gate driver 10.

Figure 3:
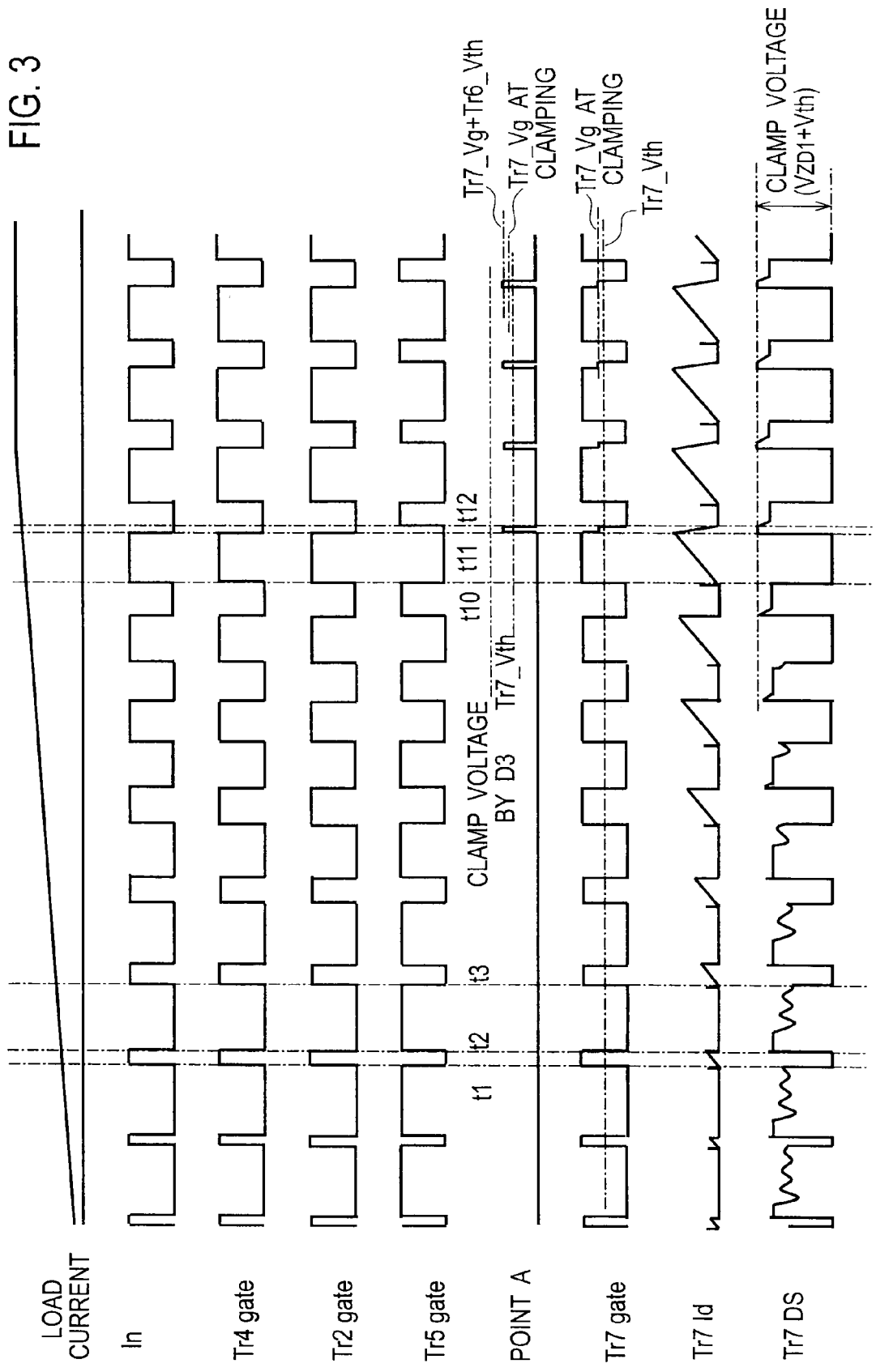
FIG. 3 is a waveform diagram illustrating operation of the switching power source of FIG. 2.

FIG. 3 is a waveform diagram illustrating operation of the switching power source of FIG. 2. At time t1, the controller IC1 supplies a control signal of high level to the input terminal In. In the gate driver 10, the high-level voltage of the control signal is applied to gates of transistors Tr2 and Tr4, to turn on the transistors Tr2 and Tr4. When the transistor Tr2 turns on, a transistor Tr5 receives at its gate a potential of 0[V] and turns off. Namely, the transistor Tr5 receives through the transistor Tr2 an inverted signal of the control signal supplied to the input terminal In. When the transistor Tr4 turns on, the control power source Vcc supplies a high-level gate voltage through the transistor Tr4 to a gate of the switch element Tr7, to turn on the switch element Tr7.

At time t2, the controller IC1 outputs a control signal of low level to the input terminal In and the gate driver 10 oppositely operates from the operation at time t1. Namely, the transistor Tr4 turns off and the transistor Tr5 turns on. When the transistor Tr5 turns on, the gate voltage of the switch element Tr7 becomes low (0 V), and therefore, the switch element Tr7 turns off.

Since an ON period between t1 and t2 is short, a drain current Id of the switch element Tr7 is small and a surge voltage at the switching-off of the switch element Tr7 does not reach an active clamp voltage. Namely, the surge voltage does not reach a zener voltage of a zener diode ZD1. Accordingly, no voltage drop occurs at a resistor R1 and potential at a point A, i.e., the voltage of the resistor R1 keeps 0 [V]. Since there is no change in the potential at the point A, the states of transistors Tr3 and Tr6 are unchanged.

When a load current increases, the controller IC1 outputs a control signal to the input terminal In according to an error signal from the output side in such a way as to extend the ON period of the switch element Tr7. In FIG. 3, the switch element Tr7 is turned on at time t10 and is turned off at time t11 In this case, the drain current Id of the switch element Tr7 is several times greater than that at time t2, and therefore, a surge voltage applied between the drain and source of the switch element Tr7 sharply increases at the time of switching off of the switch element Tr7 at time t11. This surge voltage exceeds the zener voltage of the zener diode ZD1 of the gate driver 10.

At this time, a current passes through a diode D1 and the zener diode ZD1 to the resistor R1, thereby increasing potential at the point A. As the potential at the point A increases, the transistor Tr3 turns on to turn off the transistor Tr5. As a result, the gate of the switch element Tr7 changes from the ground potential to an open state. When the potential at the point A increases, the transistor Tr6 turns on to apply a voltage from the control power source Vcc to the gate of the switch element Tr7.

A gate voltage of the transistor Tr6 is supplied from a drain voltage of the switch element Tr7 through the diode D1 and zener diode ZD1. Accordingly, a drain-source voltage of the switch element Tr7 balances with a summation of a forward voltage of the diode D1, the zener voltage of the zener diode ZD1, and the potential at the point A that is a threshold voltage of the switch element Tr7 added by a threshold voltage of the transistor Tr6.

Namely, the drain voltage of the switch element Tr7 is substantially clamped by the zener voltage of the zener diode ZD1. Energy of the surge voltage causes a drain current of the switch element Tr7 from t11 to t12 and is consumed in the switch element Tr7.

In this way, the surge voltage applied to the switch element Tr7 is substantially clamped by the zener voltage of the zener diode ZD1 of the gate driver 10, and therefore, the surge voltage will never break the switch element Tr7.

Unlike the related arts, no current flows from the zener diode ZD1 to the gate driver 10 when a surge voltage is clamped during OFF operation of the switch element Tr7. Accordingly, the zener diode ZD1 may have small surge resistance because the zener diode ZD1 is required to provide a zener current sufficient to increase potential at the point A of the resistor R1.

As mentioned above, the active clamp circuit of the gate driver and semiconductor device according to the present embodiment secures responsiveness and reduces a power loss.

As the switch element Tr7 is driven from an ON state to an OFF state in response to a control signal and the drain-source voltage of the switch element Tr7 increases to around a rated voltage thereof, the gate driver or that included in the semiconductor device according to the present embodiment operates the active clamp circuit to generate a clamp signal to clamp the drain-source voltage at the point A. According to the clamp signal, the gate driver or the semiconductor device with the gate driver outputs a drive signal through the transistor Tr6 to the gate of the switch element Tr7, to clamp the drain-source voltage. At the same time, the gate driver or that included in the semiconductor device turns on the transistor Tr3 to ground the gate of the transistor Tr5, thereby electrically isolating the driving part that is carrying out the OFF operation of the switch element Tr7 so that no current is provided by the active clamp circuit to the driving part.

The gate driver or the semiconductor device with the gate driver according to the embodiment is particularly effective when used with a switching element having no avalanche resistance, such as a GaN HEMT. The switching element made of the GaN HEMT having no avalanche resistance will break if receiving a surge voltage exceeding a rated voltage of the switching element. Accordingly, a gate driver for driving such a switching element must have an active clamp circuit. Unlike a silicon MOSFET having a gate resistance value of 10 ohms to several tens of ohms, the GaN HEMT has a gate resistance value of nearly zero ohms to increase a drive current. Namely, the active clamp circuits according to the related arts are inapplicable to the GaN HEMT because elements of the active clamp circuits of the related arts are unable to sustain such a large drive current.

On the other hand, the gate driver or the semiconductor device with the gate driver according to the present embodiment can employ the switching element having no avalanche resistance such as the GaN HEMI as the switch element Tr7. Since the switching element having no avalanche resistance has low gate resistance, it is capable of carrying out high-speed switching. In addition, the switching element can avoid power loss and breakage of the active clamp elements including the zener diode ZD1, thereby reducing the cost and size of the gate driver or the semiconductor device with the gate driver.

The semiconductor device according to the present embodiment is easy to realize in a single chip if adopting semiconductor elements of the same type (for example, GaN HEMTs) for the transistors Tr1 to Tr7.

Figure 4:
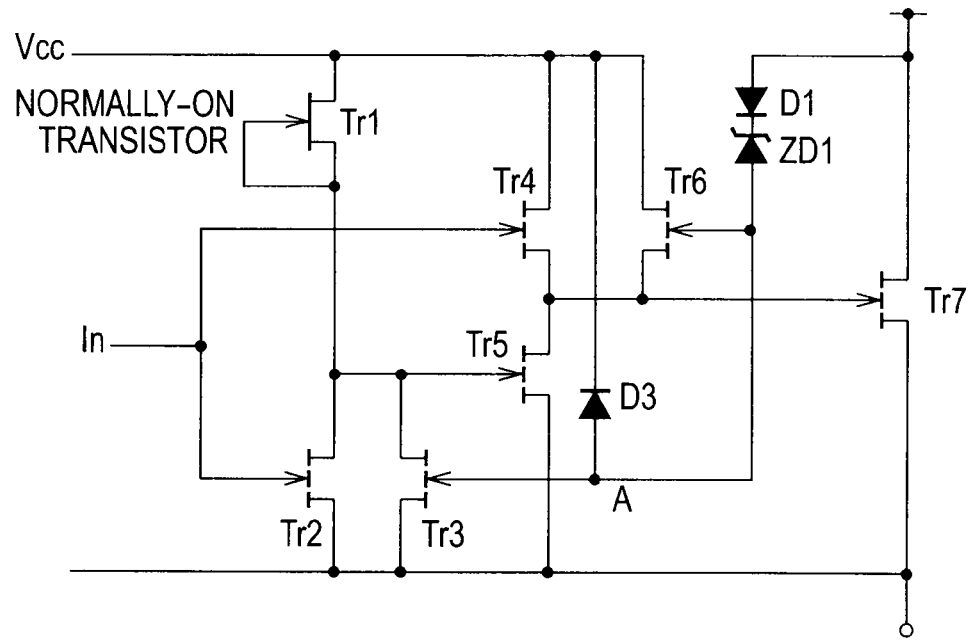
FIG. 4 is a circuit diagram illustrating a gate driver according to a modification of the embodiment of FIG. 1.

FIG. 4 is a circuit diagram illustrating a gate driver according to a modification of the present embodiment of FIG. 1. Compared with the gate driver of FIG. 1, the gate driver of FIG. 4 has no resistor R1 and additionally has a diode D3 having an anode connected to the point A and a cathode connected to the control power source Vcc. In FIG. 4, a voltage at the point A is limited by the diode D3 to a voltage of (Vcc+Vf) where Vf is a voltage across the diode D3. According to the gate driver of FIG. 1, the voltage at the point A involves unstableness that may increase the voltage at the point A higher than the withstand voltage of the transistors Tr3 and Tr6 and break the transistors Tr3 and Tr6. On the other hand, the gate driver of FIG. 4 limits the voltage at the point A with the diode D3, to avoid the transistors Tr3 and Tr6 from breaking.

Figure 5:
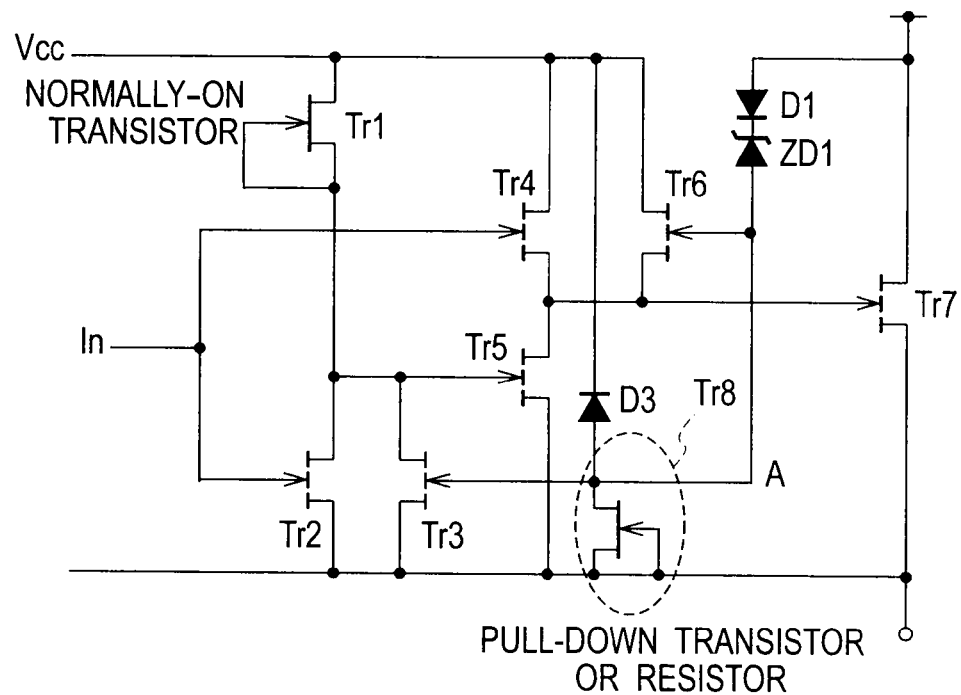
FIG. 5 is a circuit diagram illustrating a gate driver according to another modification of the embodiment of FIG. 1.

FIG. 5 is a circuit diagram illustrating a gate driver according to another modification of the present embodiment of FIG. 1. Compared with the modification of FIG. 4, the gate driver of FIG. 5 additionally has a pull-down transistor Tr8 between the point A and the source (GND) of the switch element Tr7. The gate driver of FIG. 4 has a possibility of causing a malfunction due to noise when the gates of the transistors Tr3 and Tr6 are open. On the other hand, the gate driver of FIG. 5 employing the pull-down resistance element Tr8 is resistive to such external noise. The same effect is also provided when a constant current element or a resistor is employed as the pull-down resistance element Tr8.

In this way, the gate drivers and semiconductor devices according to the present embodiments and modifications of the present invention employ the active clamp circuit that is capable of reducing power loss and securing responsiveness.

The gate drivers and semiconductor devices according to the present invention are applicable to switching power sources and the like used for electric equipment.

This application claims benefit of priority under 35 USC §119 to Japanese Patent Application No. 2010-271407, filed on Dec. 6, 2010, the entire content of which is incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A gate driver for driving a gate of a switching element, comprising:
    a driving part configured to drive the switching element according to a control signal; and
    an active clamp circuit configured to clamp the voltage between the first and second main terminals of the switching element through the driving part, the active clamp circuit including
        a first transistor configured to drive the switching element so that the voltage between the first and second main terminals of the switching element is clamped
        a second transistor configured to block a driving transistor of the driving part from turning on for switching off the switching element during the clamping operation of the active clamp circuit, wherein
    if a voltage applied between first and second main terminals of the switching element exceeds a predetermined voltage, the active clamp circuit forcibly blocks a driving operation of the driving part from switching off the switching element.

2. The gate driver of claim 1 wherein the switching element is a GaN High-Electron-Mobility-Transistor (HEMT).

3. A semiconductor device connected between terminals of a DC power source through a load and configured to control a current passing through the load, comprising:
    a second switching element connected in series to the DC power source and the load; and
    the gate driver according to claim 1.

4. The semiconductor device of claim 3 wherein the first or second switching element is a GaN High-Electron-Mobility-Transistor (HEMT).

* * * * *